United States Patent [19]

Nishimoto et al.

[11] Patent Number: 4,874,939
[45] Date of Patent: Oct. 17, 1989

[54] METHOD AND APPARATUS FOR DETECTING POSITION/VARIANCE OF INPUT LIGHT USING LINEAR AND QUADRATIC OUTPUTS

[75] Inventors: Yoshiro Nishimoto; Yasuji Yoneda; Shinichi Imaoka; Yasuhide Nakai; Akimitsu Nakaue; Yoshihiko Onishi; Hiroyuki Tachibana; Takayoshi Inoue, all of Kobe; Takuya Kusaka, Urawa; Hiroyuki Takamatsu, Kobe; Shigeki Tojyo, Osaka; Hiroshi Kajikawa; Kozo Nishimura, both of Kobe, all of Japan

[73] Assignee: Kabushiki Kaisha Kobe Seiko Sho, Kobe, Japan

[21] Appl. No.: 101,170

[22] Filed: Sep. 25, 1987

[30] Foreign Application Priority Data

Sep. 25, 1986 [JP] Japan ................. 61-224985

[51] Int. Cl.$^4$ ............................. H01J 40/14
[52] U.S. Cl. ......................... 250/211 J; 250/211 K
[58] Field of Search ............. 250/211 R, 211 J, 561, 250/211 K

[56] References Cited

U.S. PATENT DOCUMENTS 3,840,741 10/1974 Melchior ................. 250/211 J
4,749,849 6/1988 Hoeberechts et al. ......... 250/211 J

*Primary Examiner*—David C. Nelms
*Assistant Examiner*—William L. Oen
*Attorney, Agent, or Firm*—Oblon, Fisher, Spivak, McClelland & Maier

[57] ABSTRACT

An apparatus for detecting position/variance of input light is disclosed which includes a photoelectric conversion device receiving input light constituted of a first resistive layer formed of a first photoelectric conversion material and a second resistive layer formed of a second photoelectric conversion material connected with the first resistive layer through a depletion layer or directly, wherein the first resistive layer is provided with uniform resistivity throughout its surface so that a linear output proportional to the average of the distances between one end of the photoelectric conversion device and positions of the input light is detected and the second resistive layer is provided with resistivity dependent upon the distance from its one end so that a quandratic ouput proportional to the average of the squares of the distances between one end of the photoelectric conversion device and positions of the input light is detected.

9 Claims, 14 Drawing Sheets $I_1 = a_1 x$ $I_2 = a_2 x^2$

FIGURE 17 (a)
FIGURE 17 (b)
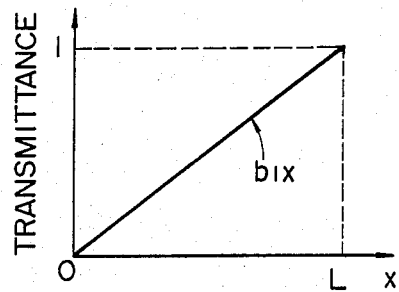
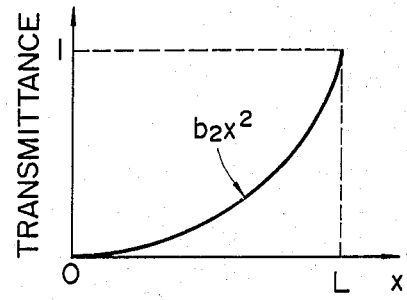
FIGURE 18 PRIOR ART
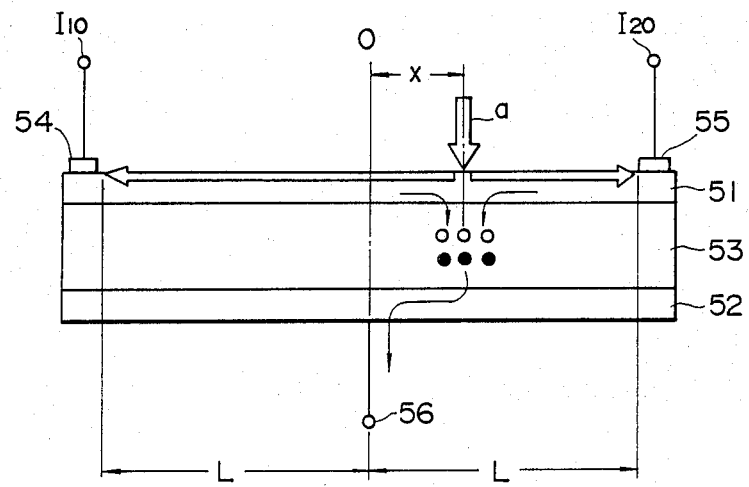

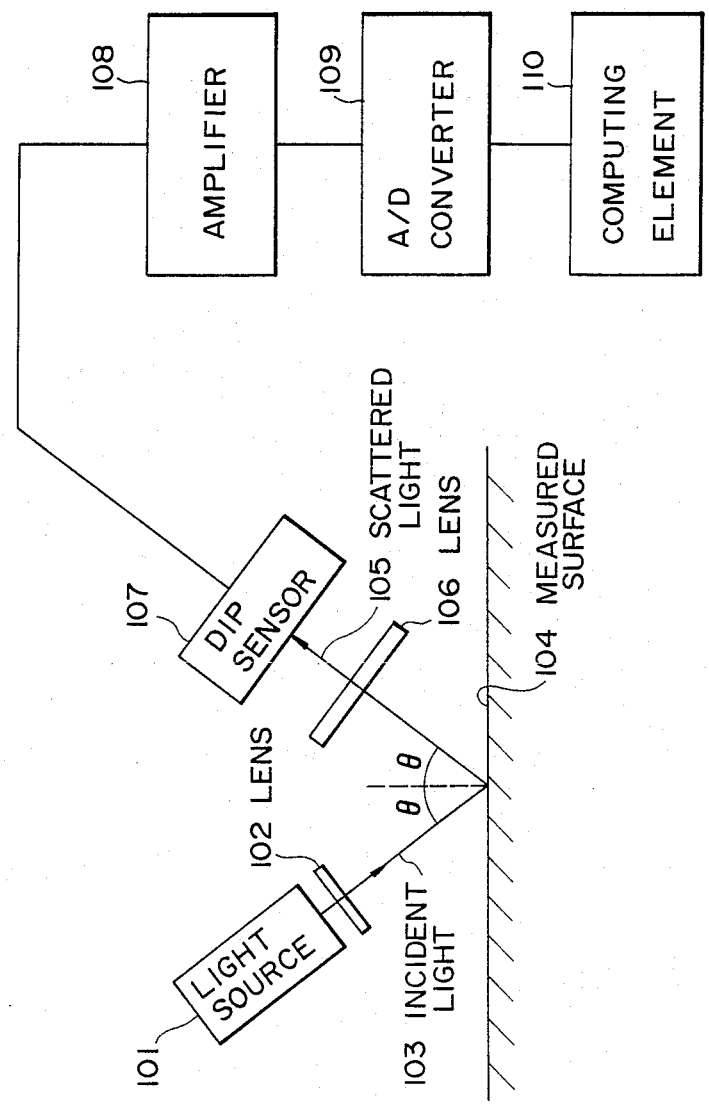

METHOD AND APPARATUS FOR DETECTING POSITION/VARIANCE OF INPUT LIGHT USING LINEAR AND QUADRATIC OUTPUTS

BACKGROUND OF THE INVENTION

1. Field of the Invention

The present invention relates to a position sensitive detector (PSD) for detecting positioning of an incident beam of light (light input) employing a photoelectric conversion device, and more particularly, to a method and apparatus for detecting position/variance of input light suitable for use, for example, in the detection of surface flaws, surface roughness, or surface shape of metallic materials and the like utilizing a beam of light or detection of defocusing produced in a measuring instrument which uses a beam of light.

2. Description of the Prior Art

FIG. 18 is a side view of a prior art position sensitive detector, for example, as described in a paper entitled "An Application of PSD to Measurement of Position", by Kazuo Kurasawa, pp. 730–737, Precision Instrument, Vol. 51, No. 4, 1985.

In this prior art position sensitive detector, a flat silicon substrate is provided as shown in FIG. 18 with a first resistive layer 51 formed of a p-type semiconductor (photoelectric conversion material) to receive a light input and a second resistive layer 52 formed of an n-type semiconductor (photoelectric conversion material) connected with the first resistive layer 51 through a depletion layer 53, in which the first resistive layer 51 is provided with uniform resistivity throughout its surface.

In order to detect the one-dimensional position and light energy of a beam of light incident on the first resistive layer 51, there are provided electrodes 54, 55 attached to both ends of the first resistive layer 51.

Further, in the center of the second resistive layer 52, there is connected a bias electrode 56.

With such a position sensitive detector, when a beam of light impinges on the first resistive layer 51 as shown by the arrow a in FIG. 18, its one-dimensional position and light energy is obtained in the following manner. In this case, the coordinate system is set up such that the middle point of the electrodes 54, 55 is taken as the origin, the coordinate of the position of incidence with respect to the origin is represented by x, and the positive direction is taken to the right in FIG. 18.

When the beam of light impinges on the first resistive layer 51 as indicated by the arrow a, there are generated electrons and positive holes proportional to the light energy at the position of incidence. The generated positive holes flow through the first resistive layer 51 and are detected as current values $I_{10}$, $I_{20}$ from the electrodes 54, 55, respectively.

The generated electron flow through the depletion layer 53 into the second resistive layer 52 and are taken out from the bias electrode 56.

At this time, the flow of the positive holes, i.e., the photoelectric current, is distributed in inverse proportion to the distances from the position of incidence to the electrodes 54, 55 on account of the uniform resistivity of the first resistive layer 51. Accordingly, representing the total length of the first resistive layer 51 by 2L, we obtain $$I_{10}/(L-x) = I_{20}/(L+x) = k \tag{1}$$

where k is a quantity depending on the light energy, not on the position of incidence x.

Then, if $(I_{10}-I_{20})/(I_{10}+I_{20})$ in connection with the measured values $I_{10}$, $I_{20}$ is obtained from equation (1), it is expressed as $$(I_{10} - I_{20})/(I_{10} + I_{20}) = \tag{2}$$

$$\frac{k \cdot (L+x) - k \cdot (L-x)}{k \cdot (L+x) + k \cdot (L-x)} = 2k \cdot x / (2k \cdot L) = x/L$$

and therefore, the position of incidence x can be measured regardless of the light energy according to $$x = L \cdot (I_{10} - I_{20})/(I_{10} + I_{20}) \tag{3}$$

And, since $(I_{10}+I_{20})$ is equal to $2k \cdot L$, the quantity k depending on the light energy is detected regardless of the position of incidence k according to $$k = (I_{10} + I_{20})/(2L) \tag{4}$$

As described above, the one-dimensional position of the beam of light incident on the first resistive layer 51 and the quantity k depending on the light energy can be obtained from the current values $I_{10}$, $I_{20}$ measured with the position sensitive detector according to equations (3), (4). Incidentally, the two-dimensional position of the beam of light can also be measured on the same principle as utilized in the above described measurement of the one-dimensional position.

In such case, a position sensitive detector as shown in FIG. 19 or FIG. 21 is used.

The position sensitive detector as shown in FIG. 19 is of a surface division type, in which two pairs of electrodes 57, 58 and electrodes 54, 55 are disposed at both ends of a first resistive layer 51 in the directions at right angles to each other. In such a position sensitive detector, while the X coordinate is obtained based on equation (3) from current values $I_{10}$, $I_{20}$ detected from the electrodes 54, 55 respectively, the y coordinate is obtained from current values $I_{30}$, $I_{40}$ detected from the electrodes 57, 58, respectively. Incidentally, FIG. 20 is an equivalent circuit diagram of the position sensitive detector as shown in FIG. 19, and referring to the FIG., P denotes a power source, D denotes an ideal diode, Cj denotes junction capacitance, $R_{sh}$ denotes a resistor in parallel, and $R_p$ denotes the positioning resistor.

The position sensitive detector as shown in FIG. 21 is of a double-side division type, in which the electrodes 57, 58 are disposed at both ends of the second resistive layer 52 at right angles to the direction between electrodes 54, 55. In this case, the second resistive layer 52 is also provided with uniform resistivity throughout its surface.

Also with such a position sensitive detector, the x coordinate is obtained from the current values $I_{10}$, $I_{20}$ detected from the electrodes 54, 55 while the y coordinate is obtained from the current values $I_{30}$, $I_{40}$ detected from the electrodes 57, 58. Here, FIG. 22 is an equivalent circuit diagram of the position sensitive detector as shown in FIG. 21.

Besides the position sensitive detector using the photoelectric conversion device as described above, there are apparatuses for detecting the position of light using an imaging device (image pick-up tube, solid state imaging element such as CCD camera) or photodiodes.

In the apparatus using an imaging device, an image of a beam of light is picked up by the imaging device and the image is converted into a digital image by analog-to-digital conversion, and the digital image is then processed by signal processing circuits as shown in FIG. 23 and FIG. 25 whereby the position of the beam of light and its spread (variance) are detected, respectively.

The signal processing circuit for detecting the position of a beam of light is, as shown in FIG. 23, made up of a timing pulse generator 60 for outputting an operation instructing signal, a comparator 61 in response to a scan signal of an image from an imaging device 59 for detecting that the signal has exceeded a predetermined threshold value, a pulse generator 62 for generating pulses over the period from the time point when the scanning is started to the time point when the detection signal from the comparator 61 is output, and a counter 63 for counting the number of pulses output from the pulse generator 62 to detect and output the count value as the position of the beam of light. Therefore, in detecting the position of the beam of light, as shown in FIG. 24, when at first the timing pulse generator 60 has output the operation instructing signal, the imaging device 59 starts scanning and simultaneously the pulse generator 62 starts to output the pulse. Then, upon the detection by the comparator 61 of the position of a light signal $P_1$ exceeding the predetermined threshold value in the scan signal from the imaging device 59, the pulse generator 62 stops its operation. In the meantime, the number of pulses from the pulse generator 62 are counted by the counter 63, and the count value is provided as the position of the beam of light.

The signal processing circuit for detecting the spread (variance) of the beam of light is, as shown in FIG. 25, made up of a comparator 61 in response to a scan signal of an image from an imaging device 59 for detecting that the signal has exceeded a predetermined threshold value, a pulse generator 64, an AND gate 65 performing a logical multiply operation on the pulse signal from the pulse generator 64 and the detection signal from the comparator 61, and a counter 66 for counting the number of pulses passed through the AND gate 64 to detect and output the count value as the spread (variance) of the beam of light. Accordingly, in detecting the spread (variance) of a beam of light, as shown in FIG. 26, the comparator 61 detects the period during which there exists a light signal $P_2$ exceeding a predetermined threshold value in the scan signal from the imaging device 59, and since the pulses from the pulse generator 64 have been passed through the AND gate 65 during that period, the number of the passed pulses is counted by the counter 63 and this count value is provided as the spread (variance) of the beam of light.

In the apparatus using photodiodes or the like, a plurality of such photodiodes or phototransistors, not shown, are disposed in a line, and it is detected on which photodiode or the like a beam of light impinges, whereby the position and spread (variance) of the beam of light are detected.

Now, the incident beam of light is not a ray but has some spread. The degree of spread, when the beam of light is a reflected beam of light from a surface as an object of inspection, bears information on flaws on or roughness of the surface or shape of it, or in the case of a measuring instrument, the degree of spread bears information about defocusing produced in the instrument. However, with position sensitive detectors using a photoelectric conversion device of the prior art, one can only obtain the position (or, to be more exact, the center-of-gravity position) of the beam of light.

Therefore, in order to detect the spread of a beam of light under existing conditions, it is required to take an image of the beam with an imaging device (such as an image pick-up tube, CCD camera) and subject it to analog-to digital conversion, and to calculate, from the obtained digital image, the spread of the beam of light by means of the signal processing circuit as described above (FIG. 25). Thus, there have been such problems that the apparatus becomes considerably large and quite expensive and laborious steps of procedure must be taken.

With the apparatus employing photodiodes or the like, high resolution is not achievable because a large number of such elements cannot be used, and therefore, such an apparatus has not been useful when high accuracy is desired.

SUMMARY OF THE INVENTION

The present invention was made to solve such problems as mentioned above and has as an object to provide a method and apparatus for detecting position/variance of input light which is compact and economical and yet capable of providing information on position and spread (variance) of the beam of light with high response and accuracy.

To achieve the above mentioned object, the method for detecting position/variance of input light according to the present invention (defined in claim 1) is characterized in that a photoelectric conversion device for receiving input light is used and a linear output which is proportional to the average value of the distances between one end of the photoelectric conversion device and the positions of the input light and a quadratic output which is proportional to the average of the squares of the above distances are taken out, and thereafter, the linear output is detected as the position of the incident light and the linear output and quadratic output are subjected to calculation whereby the variance of the input light is detected.

A first apparatus for detecting position/variance of input light according to the present invention is characterized in that it comprises a photoelectric conversion device constituted by a first resistive layer formed of a first photoelectric conversion material and a second resistive layer formed of a second photoelectric conversion material connected with the first resistive layer through a depletion layer or directly, wherein the first resistive layer is provided with uniform resistivity throughout its surface so that the above mentioned linear output is detected and the second resistive layer is provided with resistivity dependent upon the distance from its one end so that the above mentioned quadratic output is detected.

A second apparatus for detecting position/variance of input light according to the present invention is characterized in that it comprises a photoelectric conversion device the same as that in the above described first apparatus, in which the first resistive layer of the photoelectric conversion device is divided into a plurality of slip formed resistive layer segments, out of which those resistive layer segments located in the places numbered from one end by predetermined numbers are provided with uniform resistivity throughout their surfaces so that the linear output is detected, whereas those resistive layer segments located in the other places than the above mentioned places numbered from one end by predetermined numbers are provided with resistivity dependent on the distance from one end so that the quadratic output is detected.

A third apparatus for detecting position/variance of input light according to the present invention (defined in claim 5) is characterized in that it comprises two kinds of photoelectric conversion devices, of which one photoelectric conversion device is covered over the surface on the light input side by a first shielding mask which exposes the surface to the light at its portion whose width is, according to the distance from one end of the photoelectric conversion device, proportional to the distance so that the linear output is detected, and the other photoelectric conversion device is covered over the surface on the light input side by a second shielding mask which exposes the surface to the light at its portion whose width is, according to the distance from one end of the photoelectric conversion device, proportional to the square of the distance so that the quadratic output is detected.

A fourth apparatus for detecting position/variance of input light according to the present invention is characterized in that the surface of the photoelectric conversion device on the light input side is covered by a first shielding mask of the same form as that for the above described third invention so that the linear output is detected and also covered by a second shielding mask of the same form as that for the above described third invention so that the quadratic output is detected, and further, the second shielding mask is arranged so as to comprise a shutter.

A fifth apparatus for detecting position/variance of input light according to the present invention is characterized in that the photoelectric conversion device is divided by an insulating boundary which is, according to the longitudinal distance from one end of the photoelectric conversion device, located at the lateral distance proportional to the longitudinal distance, so that the linear output is detected, and also divided by an insulating boundary which is, according to the longitudinal distance from one end of the photoelectric conversion device, located at the lateral distance proportional to the square of the longitudinal distance, so that the quadratic output is detected.

A sixth apparatus for detecting position/variance of input light according to the present invention is characterized in that it comprises two kinds of photoelectric conversion devices, of which one photoelectric conversion device is covered over the surface on the light input side by a linear characteristic optical filter so that the linear output is detected and the other is likewise covered by a quadratic characteristic optical filter so that the quadratic output is detected.

According to the above described method for detecting position/variance of input light, the linear output proportional to the average of the distances between one end of the photoelectric conversion device and positions of the input light and the quadratic output proportional to the average of the squares of the above distances are detected through the photoelectric conversion device, and the variance of the input light can be obtained by simple statistical equations based on the linear output and quadratic output from the photoelectric conversion device without using expensive imaging device and signal processing circuits for the same.

Any of the above described first through sixth apparatus for detecting position/variance of input light can be directly used in executing the above mentioned method. With the first apparatus, while the linear output is detected from the current values obtained from both ends of the first resistive layer, the quadratic output is detected from the current values obtained from both ends of the second resistive layer, and the average position (center-of-gravity position) and the variance (spread) of the input light can be obtained from the results of the detections.

With the second apparatus, while the linear output is detected from the current values obtained from both ends of the odd-numbered slip-formed resistive layer segments of the first resistive layer, the quadratic output is detected from the current values obtained from both ends of the even-numbered slip-formed resistive layer segments of the first resistive layer, and therefrom are obtained the average position and the variance of the input light.

With the third apparatus, while the linear output is detected from the current value obtained from one photoelectric conversion device covered by the first shielding mask, the quadratic output is detected from the current value obtained from the other photoelectric conversion device covered by the second shielding mask, and therefrom are obtained the average position and the variance of the input light.

With the fourth apparatus, when the second shielding mask is in an OFF (open) state, the linear output is detected from the current value obtained from the photoelectric conversion device then covered by the first shielding mask, and when the second shielding mask is in an ON (closed) state, the quadratic output is detected from the current value obtained from the photoelectric conversion device then covered by the second shielding mask, and therefrom are obtained the average position and the variance of the input light.

With the fifth apparatus, while the linear output is detected from the total of the current value obtained from the insulated portion of the photoelectric conversion device bounded by the linear line and the quadratic curve and the current value obtained from the portion of the photoelectric conversion device under the quadratic curve, the quadratic output is detected from the current value obtained from the portion of the photoelectric conversion device under the quadratic curve, and therefrom are obtained the average position and the variance of the input light.

With the sixth apparatus, while the linear output is detected from the current value obtained from one photoelectric conversion device covered by the linear characteristic optical filter, the quadratic output is detected from the current value obtained from the other photoelectric conversion device covered by the quadratic characteristic optical filter, and therefrom are obtained the average position and the variance of the input light.

BRIEF DESCRIPTION OF THE DRAWINGS

FIGS. 1-3 are for showing an apparatus for detecting position/variance of input light as a first embodiment of the present invention, of which FIG. 2 is a graph showing an example of intensity distribution of a beam of light incident on the first resistive layer of the same, and FIG. 3 is a block diagram showing structure of a computing element for calculating intensity, average position, and variance of the beam of light from current values detected by the above apparatuses for detecting position/variance of input light;

FIGS. 6–9 are for showing an apparatus for detecting position/variance of input light as a fourth embodiment of the present invention, of which FIG. 6 is a side view of the same, FIGS. 7(a) and (b) are plan views showing forms of a first and a second shielding masks, respectively, FIGS. 8(a) and (b) are graphs showing the relationships between detected current values obtained from the photoelectric conversion devices covered by the first and second shielding masks, respectively, and positions on the photoelectric conversion devices, and FIG. 9 is a side view showing a variance of the apparatus of the present embodiment;

FIGS. 11 and 12 are for showing an apparatus for detecting position/variance of input light as a sixth embodiment of the present invention, of which FIG. 12 is a side view showing an example of the arrangement of the same;

FIGS. 13(a) and (b) are for showing an apparatus for detecting position/variance of input light as a seventh embodiment of the present invention, of which FIG. 13(a) is a plan view and FIG. 13(b) is a side view of the same;

FIGS. 14(a) and (b) are for showing an apparatus for detecting position/variance of input light as a eighth embodiment of the present invention, of which FIG. 14(a) is a plan view and FIG. 14(b) is a side view of the same;

FIGS. 16 and 17 are for showing an apparatus for detecting position/variance of input light as a tenth embodiment of the present invention, of which FIG. 16 is a side view of the same, and FIG. 17 (a) and (b) are graphs showing transmittance properties of a linear characteristic ND filter and a quadratic characteristic ND filter, respectively;

FIG. 18 is a side view showing a position sensitive detector of the prior art;

FIGS. 19 and 20 are for showing a position sensitive detector of the prior art of a surface division type, of which FIG. 19 is a side view of the same and FIG. 20 is its equivalent circuit diagram;

FIGS. 21 and 22 are for showing a position sensitive detector of the prior art of a double-side division type, of which FIG. 21 is a side view of the same and FIG. 22 is its equivalent circuit diagram;

FIGS. 23 and 24 are for showing a position sensitive detector using an imaging device of the prior art, of which FIG. 23 is a block diagram of the same and FIG. 24 is a timing chart therefor;

FIGS. 25 and 26 are for showing a light variance (spread) detector using an imaging device, of which FIG. 25 is a block diagram of the same and FIG. 26 is a timing chart therefor; and FIG. 27 is a block diagram showing an example of applications of the apparatus for detecting position/variance of input light of the present invention.

DESCRIPTION OF THE PREFERRED EMBODIMENTS

To begin with, the method for detecting position/variance of input light according to the present invention and its principle will be briefly described with a one dimensional detection case being taken as an example. In order to detect the variance of input light, if the average of the positions (center-of gravity position) of the input light, $\bar{x}$, and the average of the squares of the positions, $\overline{x^2}$ are obtained, then the variance of $\sigma^2$ is statistically calculated and detected as $\overline{x^2} - \bar{x}^2$.

Therefore, in the method of the present invention, a photoelectric conversion device is used which, upon receipt of input light, outputs a predetermined current corresponding to the intensity of the input light by photoelectric conversion, and firstly the intensity of the light, $\int \rho(x)dx$ (where $\rho$ represents intensity distribution of the input light), the average of the positions x of the input light weighted by the intensity of the light, $\int x \cdot \rho(x)dx$, and the average of the squares of the positions of the input light similarly weighted by the intensity of the light, $\int x^2 \cdot \rho(x)dx$, are obtained as current values.

Then, from the detected current values, $K_{10} \cdot \int \cdot \rho(x)dx / \int \rho(x)dx$ is obtained as a linear output proportional to the average value (center-of gravity position) $\bar{x}$ of the distances between one end of the photoelectric conversion device and the positions of the input light and $K_{20} \cdot \int x^2 \cdot (x)dx / \int \rho(x)dx$ is obtained as a quadratic output proportional to the average $\overline{x^2}$ of the squares of the distances between the end of the photoelectric conversion device and the positions of the input light (where $K_{10}$, $K_{20}$ are constants), and based on those outputs, the position (center-of-gravity position) $\bar{x}$ of the input light is detected as $$\int x \cdot \rho(x)dx,$$

and the variance $\sigma^2$ of the input light is detected as $$\int x^2 \cdot \rho(x)dx / \int \rho(x)dx - [\int x \cdot \rho(x)dx / \int \rho(x)dx]^2.$$

Now, practical embodiments of the apparatus for detecting position/variance of input light capable for detecting the above mentioned linear output and quadratic output and applicable to the method of the present invention will be described with reference to the accompanying drawings.

Figure 1A:
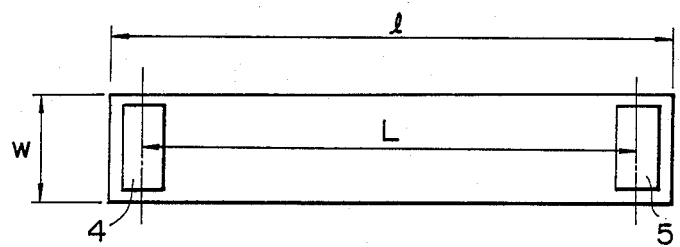
FIG. 1(a) is a side view and FIG. 1(b) is a plan view of the same.
Figure 1B:
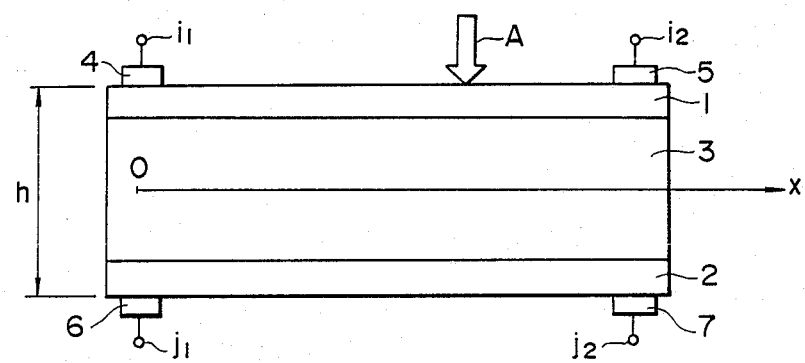
Figure 2:
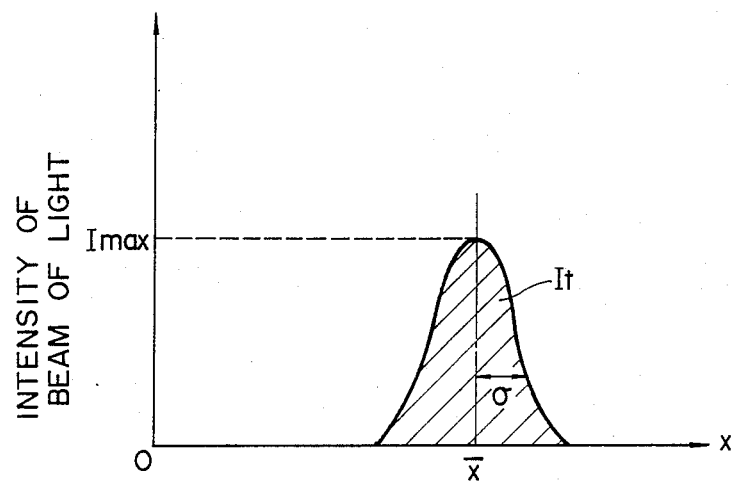
Figure 3:
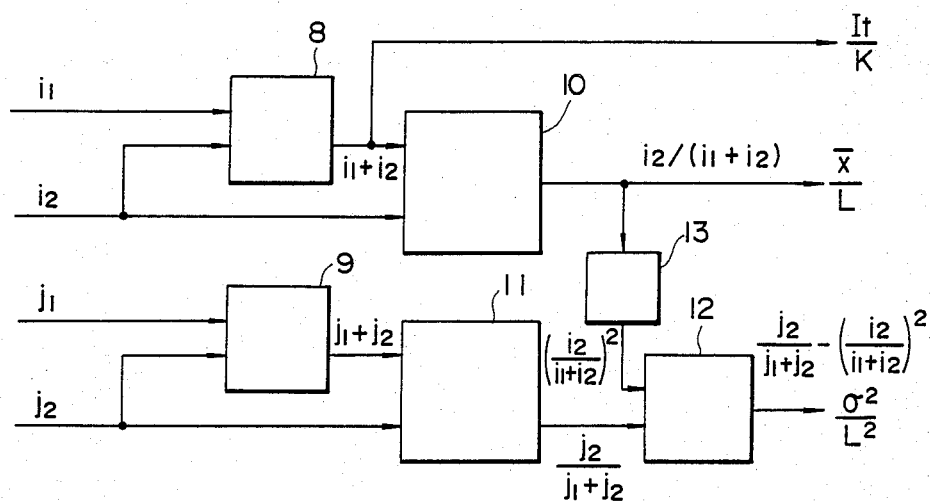

1. First Embodiment of the Present Invention:

FIGS. 1–3 show an apparatus for detecting position/variance of input light as a first embodiment of the present invention, in which FIG. 1(a) is a side view and FIG. 1(b) is a plan view of the same, FIG. 2 is a graph showing an example of intensity distribution of a beam of light incident on (input light to) a first resistive layer, and FIG. 3 is a block diagram showing structure of a computing element for calculating intensity, average position, and variance of the beam of light from current values detected by the apparatus of the present embodiment.

The first embodiment of the present invention is that for obtaining one-dimensional average position (center-of-gravity position), intensity (light energy), and variance (spread) of a beam of light. As in the prior art, the photoelectric conversion device is constituted, as shown in FIGS. 1 (a) and (b), of a first resistive layer 1 formed of a P type semiconductor as a first photoelectric conversion material and a second resistive layer 2 formed of an N type semiconductor as a second photoelectric conversion material connected with the first resistive layer 1 through a depletion layer 3, in which the first resistive layer 1 is provided with uniform resistivity throughout the surface (resistive contour density: $r_0$).

For the mentioned photoelectric conversion device of a photovoltaic type constituted of the first resistive layer 1, second resistive layer 2, and the depletion layer 3, there are provided electrodes 4, 5 attached to both ends of the first resistive layer 1 a distance L apart and electrodes 6, 7 attached to both end portions of the second resistive layer 2 corresponding to the electrodes 4, 5 respectively.

In the present embodiment, the origin is taken at the position of the electrods 4, 6 and the X axis is taken in the direction from the electrodes 4, 6 to the electrodes 5, 7.

Further, in the present embodiment, the second resistive layer 2 is so arranged that it has resistivity dependent upon the distance from the electrode 6 at its one end, that is, the resistive contour density on the second resistive layer 2 is sufficiently close to 0 at the position of the electrode 6 (x=0), the density is $r_0$ at the position of the electrode 7 (x=L), and the resistive contour density r linearly increases between these two positions, or $$r = (r_0/L) \cdot x \tag{4}$$

The electrodes 4, 5, 6, 7 are each connected with a current detector, not shown, and is adapted such that, when the photoelectric currents are generated in the apparatus for detecting position/variance of input light according to the present embodiment, the currents to flow through the electrodes 4, 5, 6, 7 are detected as $i_1$, $i_2$, $j_1$, $j_2$, respectively.

Incidentally, l, w, and h in FIGS. 1(a) and (b) represent external dimensions, i.e., length, width, and height, respectively, of the apparatus for detecting position/variance of input light of the present embodiment.

Since the apparatus for detecting position/variance of input light according to the first embodiment of the present invention is structured as described above, the intensity (light energy), average position (center-of-gravity position), and variance (spread) of the beam of light incident on the first resistive layer 1 are obtained as described below.

Suppose now that a beam of light having the intensity distribution $\rho(x)$ of Gaussian distribution as shown in FIG. 2 is incident as indicated by the arrow A in FIG. 1(a). Here, referring to the Guassian distribution, the average position is represented by $\bar{x}$, variance $\sigma^2$, maximum intensity by $I_{max}$, and the total intensity (the area indicated by hatching in FIG. 2) by It.

A bit, or element, of a beam of light, i.e., a portion thereof between [x, x+dx] generates di of positive holes and dj of electrons by photoelectric conversion, so that $$di = K \cdot \rho(x) dx = -dj \tag{5}$$

where K is efficiency of photoelectric conversion.

The positive holes di flows along the first resistive layer 1 and the electrons dj (=−di) reaches the second resistive layer 2 by way of the depletion layer 3 and flows along the second resistive layer 2. Since the first resistive layer 1 has uniform resistive contour density $r_0$, the positive holes di is taken out from the electrods 4 and 5 as $di_1$ and $di_2$, respectively, distributed in inverse proportion to the resistance from 0 to x and the resistance from x to L. Hence, $$di = di_1 + di_2 \tag{6}$$

$$di_1 = di \cdot \frac{r_0 \cdot (L-x)}{r_0 \cdot L} = di \cdot \frac{(L-x)}{L} \tag{7}$$

$$di_2 = di \cdot \frac{r_0 \cdot x}{r_0 \cdot L} = di \cdot \frac{x}{L} \tag{8}$$

The current values $i_1$, $i_2$ taken out from the electrodes 4, 5 are given, respectively, by $$i_1 = \int di_1 \tag{9}$$

$$i_2 = \int di_2 \tag{10}$$

What are actually measured are these current values $i_1$, $i_2$. From equations (10), (8), (5), $i_2$ is expressed as $$i_2 = \int di_2 = (1/L) \cdot \int x \, di$$

$$= (K/L) \cdot \int_0^L x \cdot \rho(x) dx \tag{11}$$

Thus, the average value of the coordinate x weighted by the intensity of the beam of light can be detected by the current $i_2$.

But, the current value $i_2$ also depends on the intensity of the beam of light. And so, when the total current $(i_2 + i_2)$ is obtained from equations (9), (10), (7), (8), (5), it is expressed as $$i_1 + i_2 = \int (di_1 + di_2) = \int di$$

$$= K \cdot \int_0^L \rho(x) dx = K \cdot It \tag{12}$$

Thus, we can obtain the quantity relative to the total intensity It of the beam of light. Further, from equations (11), (12), we obtain $$\frac{i_2}{i_1 + i_2} = \frac{1}{L} \cdot \frac{\int_0^L x \cdot \rho(x) dx}{\int_0^L \rho(x) dx} \tag{13}$$

Here, because $$\frac{\int_0^L x \cdot \rho(x) dx}{\int_0^L \rho(x) dx} = \bar{x} \tag{14}$$

it becomes possible to obtain a linear output proportional to the average $\bar{x}$ of the distances x from the position of the electrode 4 (one end of the photoelectric conversion device) to the positions of the beam of light. Thus, $\bar{x}/L$ as the data of center-of-gravity position of the beam of light can be obtained and K·It as the data of intensity (It) of the beam of light can be obtained from $(i_1 + i_2)$.

Then, since the second resistive layer 2 has the resistive contour density r as given by equation (4), the electron dj is distributed in inverse proportion to the resistance $R_1(x)$ from 0 to x and the resistance $R_2(x)$ from x to L and each thereof are taken out from the electrodes 6, 7 as $dj_1, dj_2$. Since $$R_1(x) = \int_0^x r\,dx = r_0 \cdot x^2/(2L) \quad (15)$$

$$R_2(x) = \int_x^L r\,dx = r_0 \cdot (L^2 - x^2)/(2L) \quad (16)$$

and the total resistance is $$R = \int_0^L r\,dx = r_0 \cdot L/2 \quad (17)$$

we obtain $$dj = dj_1 + dj_2 \quad (18)$$

$$dj_1 = dj \cdot \frac{r_0 \cdot (L^2 - x^2)/(2L)}{r_0 \cdot L/2} = dj \cdot \frac{(L^2 - x^2)}{L^2} \quad (19)$$

$$dj_2 = dj \cdot \frac{r_0 \cdot x^2/(2L)}{r_0 \cdot L/2} = dj \cdot \frac{x^2}{L^2} \quad (20)$$

The current values $j_1, j_2$ that are taken out from the electrodes 6, 7 are $$j_1 = \int dj_1 \quad (21)$$

$$j_2 = \int dj_2 \quad (22)$$

and what are actually measured are these current values $j_1, j_2$. From equations (22), (20), and (5), $j_2$ is expressed as $$j_2 = \int dj_2 = (1/L^2) \cdot \int x^2 dj$$

$$= -(K/L^2) \cdot \int_0^L x^2 \cdot \rho(x) dx \quad (23)$$

Thus, the average of the squares of the coordinates x weighted by the intensity of the beam of light can be detected by the current value $j_2$.

But the current value $j_2$ is also dependent on the intensity of the beam of light. Then, if the total current value $(j_1 + j_2)$ is obtained by using equations (21), (22), (19), (20), and (5), it is expressed as $$j_1 + j_2 + \int (dj_1 + dj_2) = \int dj$$

$$= -K \cdot \int_0^L \rho(x) dx = -K \cdot It \quad (24)$$

from which the quantity relative to the intensity of the beam of light is obtained, and from equations (23) and (24), we obtain $$\frac{j_2}{j_1 + j_2} = \frac{1}{L^2} \cdot \frac{\int_0^L x^2 \cdot \rho(x) dx}{\int_0^L \rho(x) dx} \quad (25)$$

Here, since $$\frac{\int_0^L x^2 \cdot \rho(x) dx}{\int_0^L \rho(x) dx} = \overline{x^2} \quad (26)$$

after all, it is made possible to take out a quadratic output $\overline{x^2}L^2$ proportional to the average of the squares $\overline{x^2}$ of the distance x between the position of the electrode 6 (one end of the photoelectric conversion device) and the positions of the beam of light from $j_2/(j_1 + j_2)$.

Accordingly, the variance (spread) $\rho^2$ can be obtained, based on equations (13) and (25), from $$\sigma^2 = \frac{\int_0^L (x - \overline{x})^2 \cdot \rho(x) dx}{\int_0^L \rho(x) dx} = \quad (27)$$

$$\frac{\int_0^L x^2 \cdot \rho(x) dx - \left\{ \int_0^L x \cdot \rho(x) dx \right\}^2 / \int_0^L \rho(x) dx}{\int_0^L \rho(x) dx} =$$

$$\frac{\int_0^L x^2 \cdot \rho(x) dx}{\int_0^L \rho(x) dx} - \frac{\left\{ \int_0^L x \cdot \rho(x) dx \right\}^2}{\left\{ \int_0^L \rho(x) dx \right\}^2} =$$

$$L^2 \cdot \left[ \frac{j_2}{j_1 + j_2} - \left( \frac{i_2}{i_1 + i_2} \right)^2 \right]$$

As a consequence of the foregoing, three characteristic quantities of the beam of light, $\overline{x}/L$, $\rho^2/L^2$, and $K \cdot It$, are expressed as $$\frac{\overline{x}}{L} = \frac{i_2}{i_1 + i_2} \quad (28)$$

$$\frac{\sigma^2}{L^2} = \frac{j_2}{j_1 + j_2} - \left( \frac{i_2}{i_1 + i_2} \right)^2 \quad (29)$$

$$K \cdot It = i_1 + i_2, \text{ or } -(j_1 + j_2) \quad (30)$$

Thus, by the use of a computing element as shown in FIG. 3, the average position (point-of-gravity position) $\overline{x}$, variance (spread) $\rho^2$, and intensity (light energy) It of the beam of light based on the above equations (28), (29), and (30) can be obtained from the current values $i_1$, $i_2$, $j_1$, and $j_2$ output from the electrodes 4–7. Referring to FIG. 3, reference numerals 8 and 9 denote adders, 10 and 11 denote dividers, 12 denotes a subtractor, and 13 denotes a multiplier.

The second resistive layer 2 having a resistive contour density proportional to the distance can be materialized by changing the doped quantity of impurities and also by varying the film thickness of the second resistive layer 2 in inverse proportion to the distance (resistive contour density $\alpha$ 1/film thickness $\alpha$ distance).

According to the first embodiment of the present invention, the linear output $i_2/(i_1 + i_2)$ proportional to the average value $\overline{x}$ of the distances x and the quadratic output $j_2/(j_1 + j_2)$ proportional to the average $\overline{x^2}$ of the squares of the distances x of the beam of light incident on the first resistive layer can thus be obtained not using an imaging device or the like but using a device of a very simple structure, and the average position (center-of-gravity position) $\overline{x}$ and the variance $\rho^2$ can be detected from these outputs quite easily and economically. Besides, these values can be detected with high response and accuracy.

Therefore, such advantages are also obtained that measurement of spread of a light spot, detection of defocusing in a measuring instrument using a beam of light, detection of flaws on or roughness of a surface, or shape of a surface as an object of inspection or the like can be executed with great ease.

Figure 4:
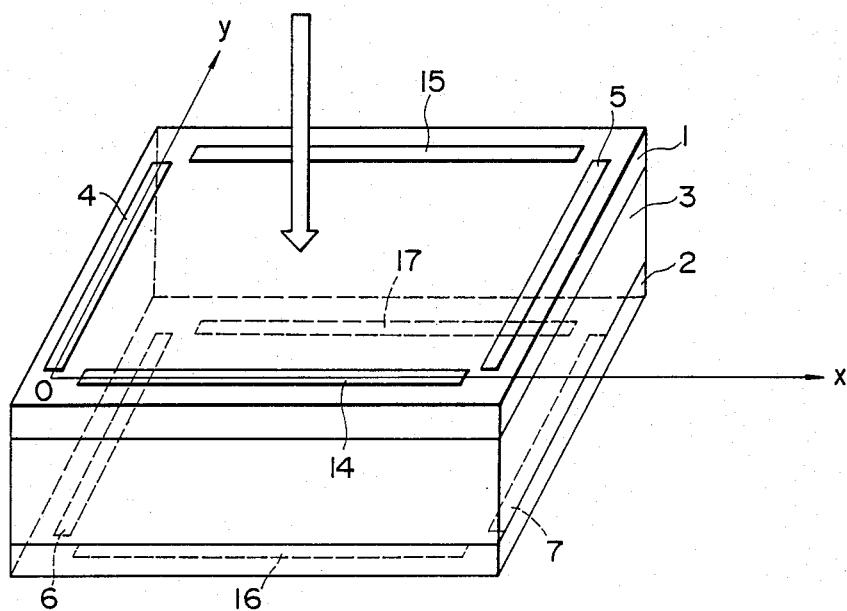
FIG. 4 is a perspective view showing an apparatus for detecting position/variance of input light as a second embodiment of the present invention.

2. Second Embodiment of the Present Invention:

FIG. 4 is a perspective view showing an apparatus for detecting position/variance of input light as a second embodiment of the present invention. The second embodiment is based on the invention as defined in claim 3 for obtaining two-dimensional average position, intensity, and variance of a beam of light. In the apparatus for detecting position/variance of input light virtually of the same structure as the first embodiment, there are provided, as shown in FIG. 4, electrodes 14, 15 attached to both ends of the first resistive layer 1 suitably spaced apart and disposed in the direction of the y axis so as to cross the electrodes 4, 5 at right angles, and further, there are provided electrodes 16, 17 attached to the second resistive layer 2 opposing the electrodes 14, 15, respectively.

The second resistive layer 2 in the present embodiment is arranged so that it has appropriate resistive contour densities linearly increasing along both the x and y axes.

Therefore, the present embodiment performs a function, as the extension of the one-dimensional detection performed by the first embodiment, of two-dimensional detection of intensity, average position, and variance of a beam of light. That is, the method for obtaining $\bar{x}$ from the electrodes 4, 5 and $\bar{x^2}$ from the electrodes 6, 7 is the same as in the one-dimensional detection and the variance $\rho X^2$ in the direction of the x axis is similarly obtained from these data. And further, it is possible to obtain $\bar{y}$ from the electrodes 14, 15 and $\bar{y^2}$ from the electrodes 16, 17, and from these data, the variance of $\rho y^2$ in the direction of the y axis.

Thus, two-dimensional point-of-gravity position (x, y), variance ($\rho x^2$, $\rho Y^2$), and intensity (It) of the beam of light can be obtained and similar effects to those attained in the first embodiment can be attained.

However, the intensity It is obtained from the sum of the current values taken out from four electrodes of either the first resistive layer 1 or the second resistive layer 2 as shown in FIG. 4.

Figure 5:
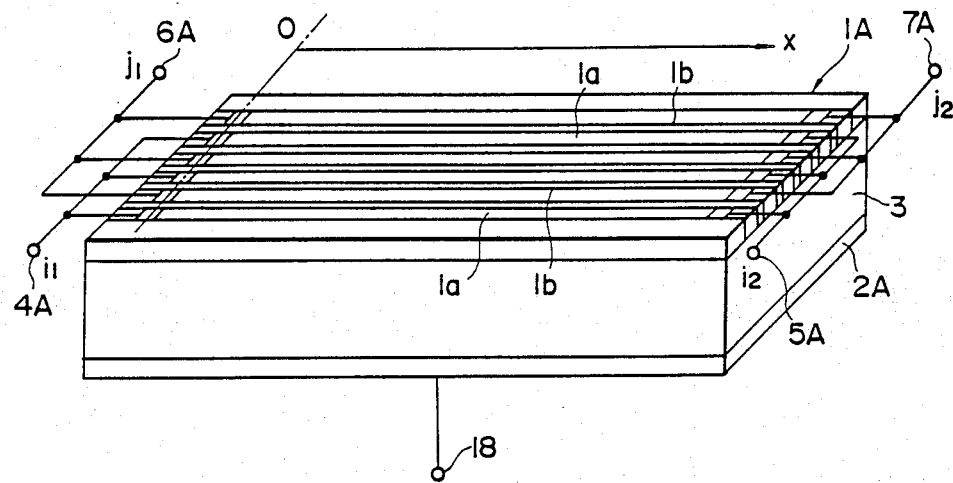
FIG. 5 is a perspective view showing an apparatus for detecting position/variance of input light as a third embodiment of the present invention.

3. Third Embodiment of the Present Invention:

FIG. 5 is a perspective view showing an apparatus for detecting position/variance of input light as a third embodiment of the present invention. The third embodiment is for obtaining one-dimensional average position, intensity, and variance of a beam of light based on the invention as defined in claim 4. As shown in FIG. 5, the third embodiment is provided with a first resistive layer 1A formed of a P type semiconductor to receive a light input and a second resistive layer 2A formed of N type semiconductor connected with the first resistive layer 1A through a depletion layer 3, in which the second resistive layer 2A is connected to a bias electrode 18. The first resistive layer 1A is divided into a plurality of slip formed resistive layer segments 1a, 1b.

The slip resistive layer segments 1a, 1b are disposed in an alternate manner, of which the slip formed resistive layer segments 1a located at odd numbered places (predetermined alternate places) are provided with uniform resistivity throughout the surfaces, whereas the slip formed resistive layer segments 1b located at even numbered places (other places than the above predetermined alternate places) are provided with the resistive contour density linearly increasing in the direction of the x axis.

And, while each slip formed resistive layer 1a is attached to electrodes 4A, 5A at both end portions thereof, each slip formed resistive layer ib is attached to electrodes 6A, 7A at both end portions thereof, and it is adapted such that the linear output and quadratic output are, in the same manner as in the above first embodiment, obtained from current values $i_1$, $i_2$, $j_1$, and $j_2$ detected from the electrodes 4A, 5A, 6A, and 7a, whereby one-dimensional average position, intensity, and variance of the beam of light can be detected and the same effects as obtained from the first embodiment can be provided.

Incidentally, if the second resistive layer 2A is arranged to cross the first resistive layer 1A at right angles and is divided into slip formed resistive layer segments similar to the slip formed resistive layer segments 1a, 1b, so that the average position, intensity, and variance of the beam of light may be detected in the direction of the y axis in the same manner as the average position, intensity, and variance of the beam of light are detected in the direction of the x axis by the slip formed resistive layer segments 1a, 1b, of the first resistive layer 1A, two-dimensional detection of the average position, intensity, and variance of the beam of light can be achieved even by the present embodiment based on the invention as defined in claim 4.

Since semiconductors of amorphous silicon were used in the above described first to third embodiments, a depletion layer was provided between the first resistive layer and the second resistive layer, but if crystal silicon is used, the need for provision of the depletion layer can be eliminated because a depletion layer is formed on the interface even if the P layer and the N layer are connected directly,.

Figure 6:
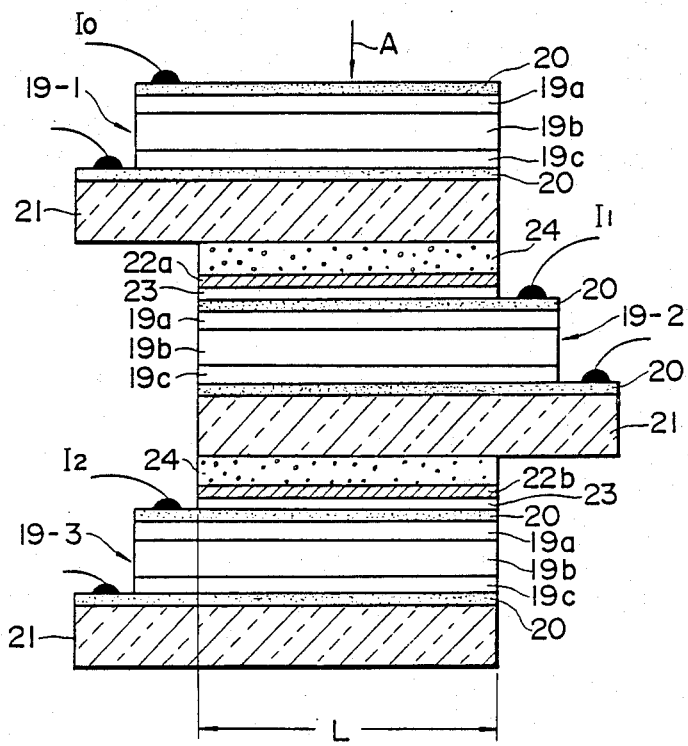
Figure 7:
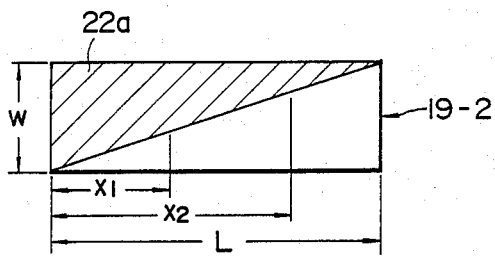
Figure 7:
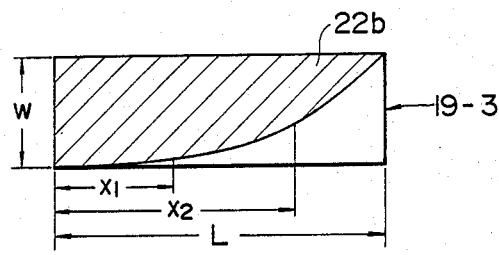
Figure 8:
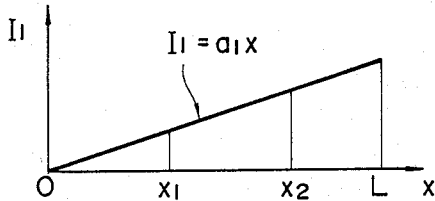
Figure 8:
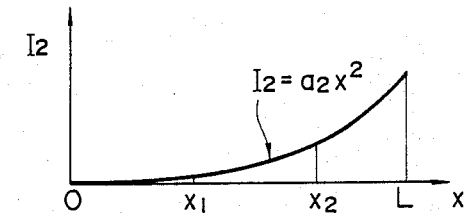
Figure 9:
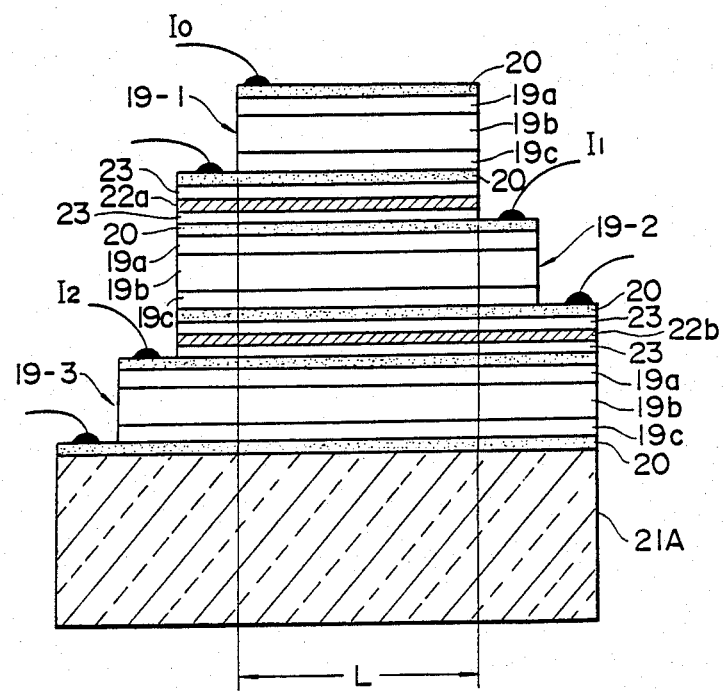

4. Fourth Embodiment of the Present Invention:

FIGS. 6–9 are for showing an apparatus for detecting position/variance of input light as a fourth embodiment of the present invention, in which FIG. 6 is a side view for showing the same, FIGS. 7(a) and (b) are plan views showing, respectively, forms of a first and a second shielding masks, FIGS. 8(a) and (b) are graphs showing relationships between the detected current values by the photoelectric conversion devices masked by the first and the second masks and the positions on the photoelectric conversion devices, and FIG. 9 is a side view showing a variation of the apparatus of the present embodiment.

The fourth embodiment is for obtaining one-dimensional average position, intensity, and variance of a beam of light based on the invention as defined in claim 5. As shown in FIG. 6, the fourth embodiment is provided with three photodiodes 19-1 to 19-3 as photoelectric conversion devices having translucency, each photodiode being constituted of a p layer 19a, i layer 19b, and an n layer 19c and adapted upon receipt of a light input to output a predetermined current by photoelectric conversion corresponding to the light intensity. Onto the top and bottom surfaces of each of the photodiodes 19-1 to 19-3 are attached transparent and electrically conductive films 20, through which it is adapted such that $I_0$, $I_1$, and $I_2$ from the photodiodes 19-1 to 19-3 are obtained. Each of the diodes 19-1 to 19-3 with the transparent conductive films attached to both the top and bottom surfaces thereof is mounted on a glass substrate.

In the present invention, while the surface of the photodiode 19-2 on the input light side is covered by a first shielding mask 22a of the form as shown in FIG. 7(a) through an insulating protection film 23 having translucency, the surface of the photodiode 19-3 on the input light side is covered by a second shielding mask 22b of the form as shown in FIG. 7(b) through an insulating protection film 23 having translucency.

Namely, the boundary line between the shielded portion by the first shielding mask 22a and photosensitive portion of the photodiode 19-2 becomes a linear line given by $y = (w/L) \cdot x$ when the origin is taken at the bottom left-hand corner of the photodiode 19-2, the x axis is taken to the right, and the y axis is taken upwardly. Thus, the photodiode 19-2 is adapted to be exposed to the light at its portion whose width at a position x is proportional to x, $(w/L) \cdot x$, by means of the shielding mask 22a. Likewise, the boundary line between the shielded portion by the second shielding mask 22b and the photosensitive portion of the photodiode 19-3 becomes a parabola defined by $y = (w/L^2) \cdot x^2$ when the same coordinate system as above is taken. And thus, the photodiode 19-3 is adapted to be exposed to the light at its portion whose width at a portion x is proportional to the square of x, $(w/L^2) \cdot x^2$ by means of the shielding mask 22b.

The photodiodes 19-2 and 19-3 whose top surfaces are covered by the shielding masks 22a and 22b as described above and the photodiodes 19-1 are piled up in the order of 19-1, 19-2, and 19-3 from above through transparent adhesive layers 24.

With the above described construction, the total intensity, average position $\bar{x}$, and the variance $\rho^2$ of a beam of light are obtained in the following manner.

Supposing now that a beam of light having the same intensity distribution $\rho(x)$ as shown in FIG. 2 is incident as indicated by the arrow A in FIG. 6, the current value $I_0$ detected by the photodiode 19-1 whose photosensitive surface is not shielded at all becomes $$I_0 = K_0 \cdot \int_0^L \rho(x) dx = K_0 \cdot It \quad (31)$$

and from this current value $I_0$ is obtained the quantity relative to the intensity It of the beam of light. The current value $I_1$ detected by the photodiode 19-2 covered by the shielding mask 22a has a relationship with the incident position x of the beam of light as shown in FIG. 8(a) and therefore expressed as $$I_1 = K_1 \cdot a_1 \cdot \int_0^L x \cdot \rho(x) dx \quad (32)$$

and it leads to the fact that the average value of the coordinate x weighted by the intensity of the beam of light can be detected by the current value $I_1$. Likewise, the current value $I_2$ detected by the photodiode 19-3 covered by the shielding mask 22b has a relationship with the input position x of the beam of light as shown in FIG. 8(b) and therefore expressed as $$I_2 = K_2 \cdot a_2 \cdot \int_0^L x^2 \cdot \rho(x) dx \quad (33)$$

and such leads to the fact that the average of the squares of the coordinates x weighted by the intensity of the beam of light can be detected by the current value $I_2$. In the above description $K_0$, $K_1$, and $K_2$ are denote the efficiency of photoelectric conversion of each of the photodiodes 19-1 to 19-3.

Hence, from (14), (31), (32), we obtain $$I_1/I_0 = (K_1/K_0) \cdot a_1 \cdot \bar{x} \quad (34)$$

and, from this $I_1/I_0$, a linear output proportional to the average $\bar{x}$ of the distances x between one end of the photodiode 19-2 and the positions of the beam of light can be taken out.

And, from (26), (31), (33), we obtain $$I_2/I_0 = (K_2/K_0) \cdot a_2 \cdot \overline{x^2} \quad (35)$$

and from this $I_2/I_0$ can be obtained a quadratic output proportional to the average $\overline{x^2}$ of the squares of the distances x between one end of the photodiode 19-3 and the positions of the beam of light.

In reality, the light quantity of the beam of light is gradually attenuated as it is transmitted through the photodiodes 19-1 to 19-3 in succession, and therefore, it is required to obtain the attenuation factor in advance and take it into consideration in making calculations according to the above equations (32)–(35). However, for simplicity's sake, the present embodiment is described on the assumption that there is produced no such attenuation in the beam of light.

In the present embodiment, according to the above results, the intensity It of the beam of light is obtained from equation (31) and the average position $\bar{x}$ of the beam of light from equation (34), and further, the variance $\rho^2$ is obtained, based on equations (34) and (35), from the following equation (36).

$$\sigma^2 = \frac{K_0}{K_2 \cdot a_2} \cdot \frac{I_2}{I_0} - \left(\frac{k_0}{K_1 \cdot a_1} \cdot \frac{I_1}{I_0}\right)^2 \quad (36)$$

In the present embodiment, if, for example, slit light whose width is negligible is incident on the apparatus in two different positions $x_1$ and $x_2$ as shown in FIGS. 7 and 8 (here, it is assumed that $K_0 = K_1 = K_2 = 1$, for simplicity's sake), then the detected current values $I_1, I_2$ will be $$I_1 = a_1 \cdot (x_1 + x_2) \quad (37)$$

$$I_2 = a_2 \cdot (x_1^2 + x_2^2) \quad (38)$$

From these equations (37), (38), we obtain $$(x_1 - x_2)^2 = 2 I_2/a_2 - (I_1/a_1)^2 \quad (39)$$

and from equation (39), the distance $|x_1 - x_2|$ between the two bundles of rays can be detected.

Thus, also by the apparatus of the present embodiment, the linear output can be obtained based on equation (34) and the quadratic output can be obtained from equation (35) and thereby, the one-dimensional average position, intensity, and variance of a beam of light can be detected and the same effect as in the first embodiment can be obtained, and further, when two bundles of rays are incident, the distance therebetween can also be detected from equation (39).

Although the apparatus shown in FIG. 6 is constructed such that the photodiodes 19-1 to 19-3 are each mounted on a glass substrate 21 and then piled up through an adhesive layer 24, the apparatus may also be arranged such that the photodiodes 19-1 to 19-3 are directly piled up through a protective insulating film 23 and the whole is mounted on a single glass substrate 21A as shown in FIG. 9. By so doing, such effects will be obtained that the apparatus can be made thinner, and further, stray light due to reflection by the glass substrates 21 within the apparatus can be reduced.

Figure 10:
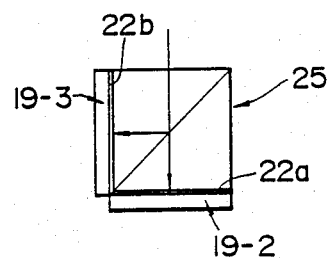
FIG. 10 is a side view showing an apparatus for detecting position/variance of input light as a fifth embodiment of the present invention.

5. Fifth Embodiment of the Present Invention:

FIG. 10 is a side view of an apparatus for detecting position/variance of input light as a fifth embodiment of the present invention. The present fifth embodiment, like the above described fourth embodiment, is based on the invention as defined in claim 5. What is different in the fifth embodiment from the above described fourth embodiment is that the photodiodes 19-2 and 19-3 are changed from the piled up structure to a structure such that a beam of light incident thereon is split and directed to two surfaces by means of a beam splitter 25, and thereby, the one-dimensional average position, intensity, and variance of the beam of light are made obtainable.

That is, as shown in FIG. 10, a beam of light is first introduced to the beam splitter 25 and split by the beam splitter 25 into two directions at right angles to each other to reach the photodiode 19-2 covered by the first shielding mask 22 [refer to FIG. 7 (a)] and to the photodiode 19-3 covered by the second shielding mask 22b [refer to FIG. 7 (b)], so that the current values $I_1$, $I_2$ corresponding to equations (32), (33) are obtained from those photodiodes 19-2, 19-3.

Although, there is not shown in FIG. 10 a photoelectric conversion device for detecting the intensity of the beam of light corresponding to the photodiode 19-1 in the fourth embodiment, it is in reality arranged by means of another beam splitter, a half mirror, or the like, such that the incident beam of light is introduced to the photoelectric conversion device, not shown, for detecting the light intensity, and thereby, the detected current corresponding to the current value $I_0$ in the fourth embodiment can be obtained.

Thus, also by the apparatus of the present embodiment, the intensity of the beam of light It can be obtained from the equation (31), the average position $\bar{x}$ of the beam of light can be obtained from equation (34), and the variance $\rho^2$ can be obtained from equation (36), and the same effect as obtained in the fourth embodiment can be obtained. Besides, according to the present embodiment, since the beam of light is directly introduced to the photodiodes 19-2 and 19-3, occurrences in the fourth embodiment such as attenuation of the beam of light, stray light resulting from the glass substrate, and interference with the detection by the shielding mask 22a on the upper side are avoided and therefore accuracy in the measurement can be improved.

Figure 11A:
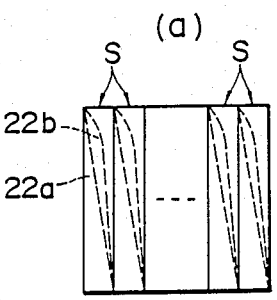
FIG. 11(a) is a plan view and FIG. 11(b) is a front view of the same.
Figure 11B:
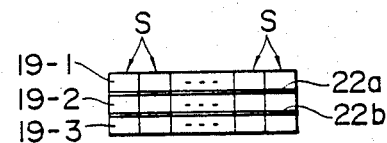
Figure 12:
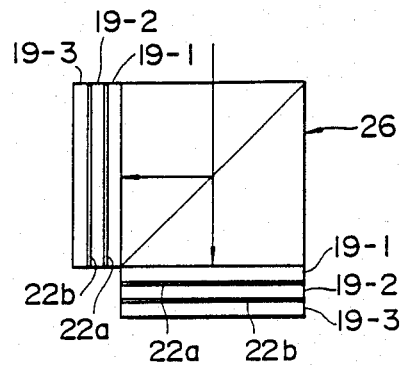

6. Sixth Embodiment of the Present Invention:

FIGS. 11 and 12 are for showing an apparatus for detecting position/variance of input light as a sixth embodiment of the present invention, of which FIG. 11(a) is a plan view and FIG. 11(b) is a front view of the same and FIG. 12 is a side view showing an example of arrangement of the same. The present sixth embodiment, like the above described fourth and fifth embodiments, is also based on the invention as defined in claim 5. The apparatus of the present embodiment is formed of a plurality of the devices S structured the same as the fourth embodiment (refer to FIG. 6), which are arranged side by side on a plane as shown in FIGS. 11(a) and (b).

By detecting current values $I_0$, $I_1$, $I_2$ for each device S with the described arrangement, the light intensity at each position of the device S can be obtained according to equation (31), and besides, the average position and variance of the input light at each position of the device S in the longitudinal direction [the vertical direction on FIG. 11(a)] can be obtained according to equations (34), (36), respectively.

Therefore, according to the present embodiment, even if, for example, a beam of light having a considerable area of circular spread is incident on the apparatus, the input light can be detected as a collection of strip-formed beams divided by each of the devices S. Hence, the input light can be detected not only for intensity but also for vertical position and variance as described above regardless of the position of the incidence of the input light.

Further, by preparing two devices as shown in FIGS. 11(a) and (b) and arranging them as shown in FIG. 12 so that an incident beam of light may be split into two directions at right angles with each other by means of a beam splitter 26 and received by the two apparatuses, it becomes possible not only to detect vertical position and variance but also to detect horizontal position and variance of the input light. Thus, it is enabled to detect two-dimensional positioning and variance of input light very accurately.

Figure 13A:
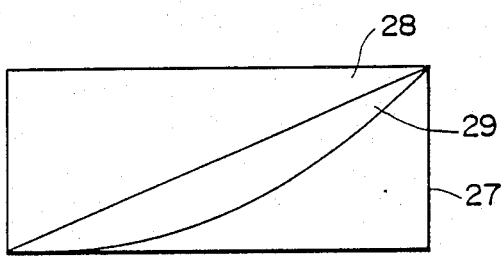
Figure 13B:
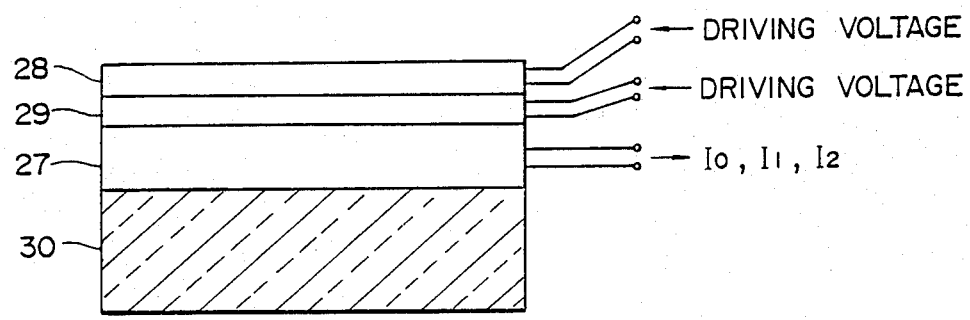

7. Seventh Embodiment of the Present Invention:

FIGS. 13(a), (b) are for showing an apparatus for detecting position/variance of input light as a seventh embodiment of the present invention, of which FIG. 13(a) is a plan view and FIG. 13(b) is a side view of the same.

This seventh embodiment is based on the invention as defined in claim 6 for obtaining one-dimensional average position, intensity, and variance of a beam of light. The apparatus is constructed such that a photodiode 27 as a photoelectric conversion device is mounted on a glass substrate 30 and the surface of the photodiode 27 on the side of the input light is covered by a first shielding mask 28 of the same form as that shown in FIG. 7(a) and a second shielding mask 29 of the same form as that shown in FIG. 7(b) Both the shielding masks 28 and 29 are structured as liquid crystal shutters.

That is, in the apparatus of the present embodiment, when both the shielding masks 28, 29 are in an off (open) state, the input light is introduced into the photodiode 27 not shielded at all, and therefrom, the current value $I_0$ corresponding to equation (31) is detected. When the shielding mask 28 is brought into an ON (closed) state by application of a driving voltage, the current value $I_1$ corresponding to equation (32) is detected, and further, when the shielding mask 29 is brought into an ON (closed) state by application of a driving voltage, the current value $I_2$ corresponding to equation (33) is detected.

Accordingly, in the present embodiment, by controlling the application of driving voltages so that operations for turning OFF both the shielding masks 28 and 29, for turning ON only the shielding mask 28, and for turning ON the shielding mask 29 are repeated at predetermined intervals, the current values $I_0$, $I_1$, and $I_2$ can be detected on a time-division basis, and by combining these values, the intensity of the beam of light It can be obtained from equation (31), the average position $\bar{x}$ of the beam of light can be obtained from equation (34), and the variance $\rho^2$ can be obtained from equation (36). Thus, the effects as obtained from the fourth embodiment can be obtained, and what is more, such is achieved only by having one set of photodiode 27 provided, thus not requiring a plurality of photodiodes piled up. Therefore the effect to make the apparatus itself thinner can also be obtained.

Although a liquid crystal is used as the shutter in the present embodiment, electrooptic crystals of PLZT (lead lanthanum zirconate titanate), KDP (potassium dihydrogen-phosphate), or the like may be used, instead.

Figure 14A:
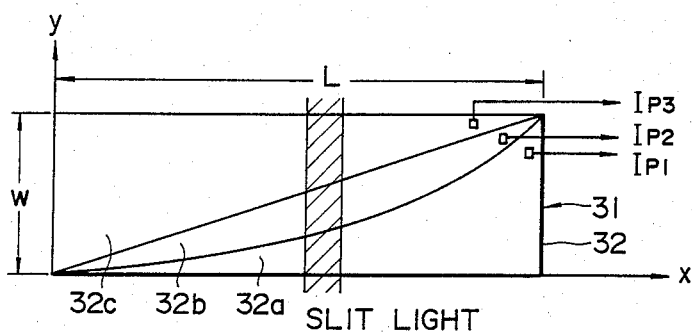
Figure 14B:
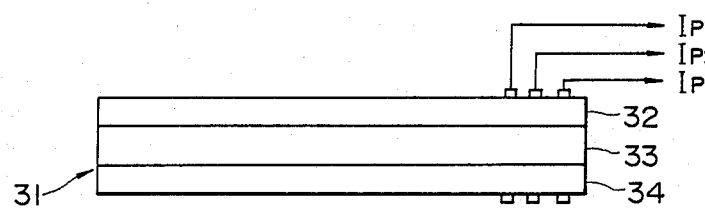

8. Eighth Embodiment of the Present Invention:

FIGS. 14(a), (b) are for showing an apparatus for detecting position/variance of input light as an eighth embodiment of the present invention, of which FIG. 14(a) is a plan view and FIG. 14(b) is a side view of the same.

This eighth embodiment is based on the invention as defined in claim 8 for obtaining one dimensional average position, intensity, and variance of a beam of light, and as shown in FIGS. 14(a) and (b), provided with a photodiode 31 as a photoelectric conversion device constituted of a p layer 32, an i layer 33, and an n layer 34, in which the p layer 32 is divided in an insulated manner into three divisions 32a, 32b, and 32c through a linear line represented by $y = (w/L) \cdot x$ and a parabola represented by $y = (w/L^2) \cdot x^2$, and it is adapted such that current values $I_{P1}$, $I_{P2}$, and $I_{P3}$ are detected from the corresponding divisions 32a, 32b, and 32c. In the above discussion, the coordinate system, (x, y), is set up the same as in the fourth embodiment.

With the above described structure, when a beam of slit light having the distribution of light intensity $\rho(x)$ in the x direction as shown in FIG. 2 and uniform distribution of light intensity in the y direction impinges on the hatched portion in FIG. 14(a), the total intensity It, average position $\bar{x}$, and the variance of the beam of light are obtained in the following way.

Also in the present embodiment, there is a relationship as shown in FIG. 8(a) between the position x and the detected current values $I_{P1} + I_{P2} (= I_{J1})$, and there is a relationship as shown in FIG. 8(b) between the position x and the detected current value $I_{P1} (= I_2)$. Then, representing the efficiency of photoelectric conversion by K and setting $a_1 = w/L$ and $a_2 = w/L^2$ for simplicity's sake, the detected current values $I_{P1}$, $I_{P2}$, and $I_{P3}$ are expressed as $$I_{P1} = K \cdot \int_0^L \rho(x) \cdot a_2 x^2 dx \quad (40)$$

$$I_{P2} = K \cdot \int_0^L \rho(x) \cdot (a_1 x - a_2 x^2) dx \quad (941)$$

$$I_{P3} = K \cdot \int_0^L \rho(x) \cdot a_1 (L-x) dx \quad (42)$$

From these equations (40)–(42), we obtain $$\begin{aligned} I_{P1} + I_{P2} + I_{P3} &= K \cdot \int_0^L \rho(x) \cdot a_1 \cdot L dx \\ &= K \cdot w \cdot \int_0^L \rho(x) dx \\ &= K \cdot w \cdot It \end{aligned} \quad (43)$$

$$I_{p1} + I_{p2} = K \cdot \int_0^L \rho(x) \cdot a_1 x dx \quad (44)$$

Here, equations (43), (44), and (40) correspond to equations (31), (32), and (33) in the fourth embodiment, respectively.

Therefore, the quantity relative to the total intensity of the beam of light is obtained from equation (43). And from equation (14), (43), and (44), we obtain $$\frac{I_{P1} + I_{P2}}{I_{P1} + I_{P2} + I_{P3}} = \frac{x}{L} \quad (45)$$

and by this $(I_{P1} + I_{P2})/(I_{P1} + I_{P2} I_{P3})$ is taken out the linear output proportional to the average $\bar{x}$ of the distances x between one end of the photodiode 31 and the positions of the beam of light. Further, from equations (26), (43), and (40), we obtain $$\frac{I_{P1}}{I_{P1} + I_{P2} + I_{P3}} = \frac{x^2}{L^2} \quad (46)$$

and by this $I_{P1}/(I_{P1} + I_{P2} + I_{P3})$ is taken out the quadratic output proportional to the average $\bar{x^2}$ of the squares of the distances x between one end of the photodiode 31 and the positions of the beam of light.

As a result of the foregoing, the total intensity It of the beam of light is obtained from equation (43) and the average position $\bar{x}$ of the beam of light is obtained from equation (45), and based on equations (45) and (46), the variance $\rho^2$ is obtained from the following equation (47)

$$\sigma^2 = \frac{I_{P1}}{I_{P1} + I_{P2} + I_{P3}} - \left( \frac{I_{P1} + I_{P2}}{I_{P1} + I_{P2} + I_{P3}} \right)^2 \quad (47)$$

Thus, also from the present embodiment, the same effect as obtained from the seventh embodiment can be obtained.

Figure 15:
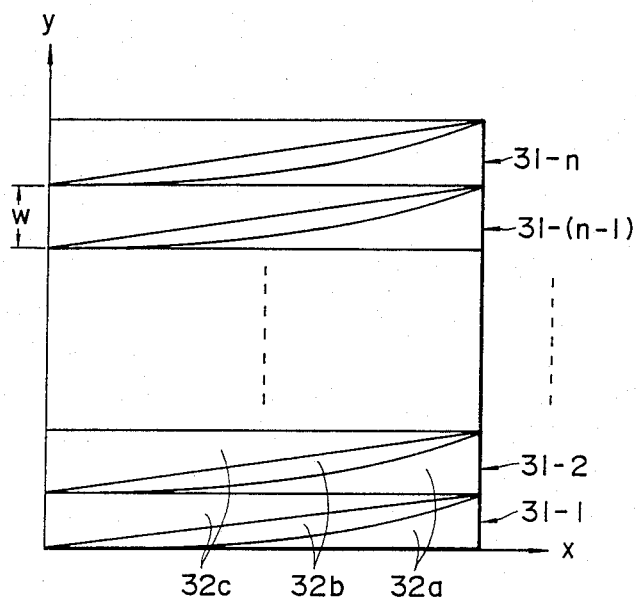
FIG. 15 is a plan view showing an apparatus for detecting position/variance of input light as a ninth embodiment of the present invention.

9. Ninth Embodiment of the Present Invention:

FIG. 15 is a plan view showing an apparatus for detecting position/variance of input light as a ninth embodiment of the present invention. Although this ninth embodiment is based on the invention as defined in the eighth embodiment, the apparatus of the present embodiment is provided with n pieces photodiodes, of a width of $\Delta w$, structured as that in the eighth embodiment and these photodiodes are arranged as shown in FIG. 15 on one plane in the y direction in the order from 31-1 to 31-n.

With the described structure, when a spot beam, not a slit beam as in the eighth embodiment, impinges on the apparatus where it is arranged such that $\Delta w < D$ (D: diameter of the spot beam), the distribution of light intensity in the y direction on each of the diodes 31-1 to 31-n is considered virtually uniform. By detecting current values, $I_{P1}$, $I_{P2}$, and $I_{P3}$ for each photodiode 31-1–31-n, the intensity of the spot beam at the position of each photodiode 31-1–31-n can be obtained according to equation (43), and the average position and variance of the spot beam at each position can be obtained according to equations (45) and (47), respectively, and thus the same effect as obtained from the sixth embodiment can be obtained.

Figure 16:
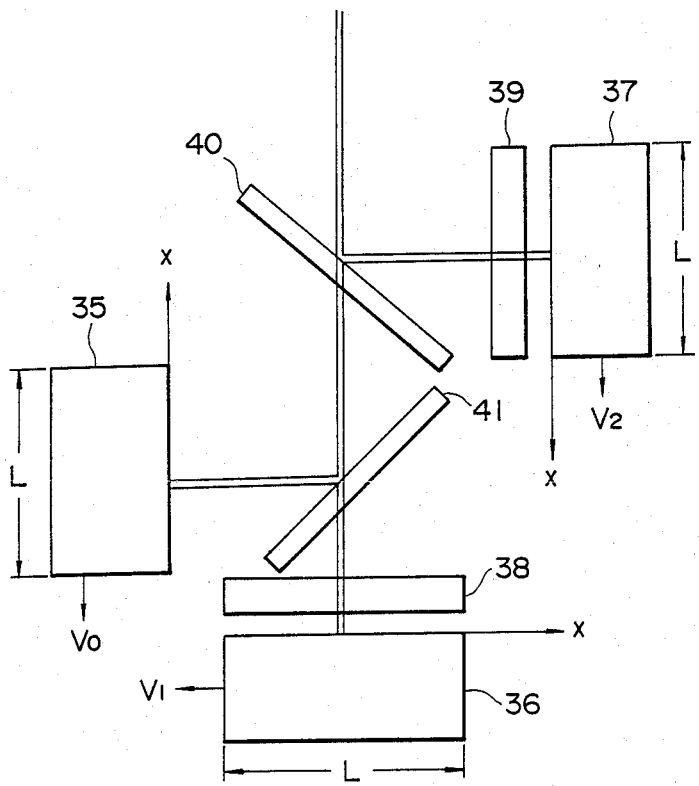
Figure 19:
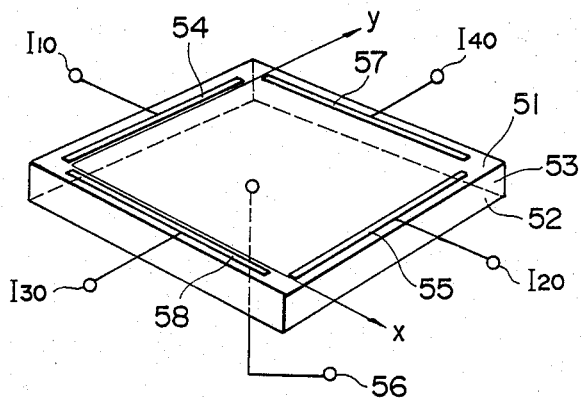
Figure 20:
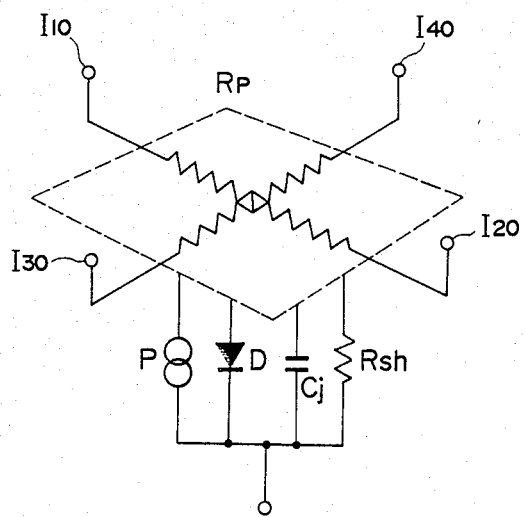
Figure 21:
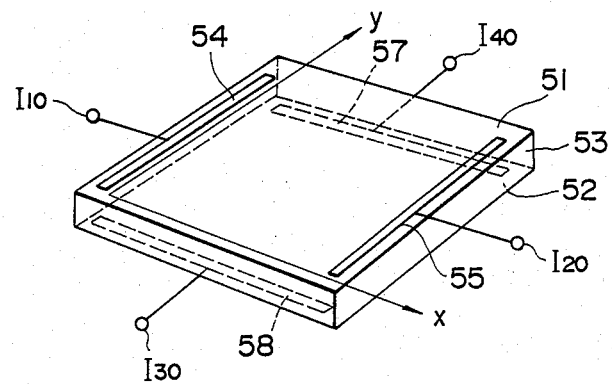
Figure 22:
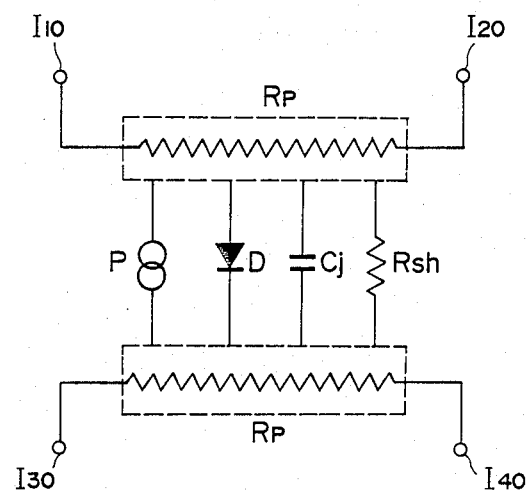
Figure 23:
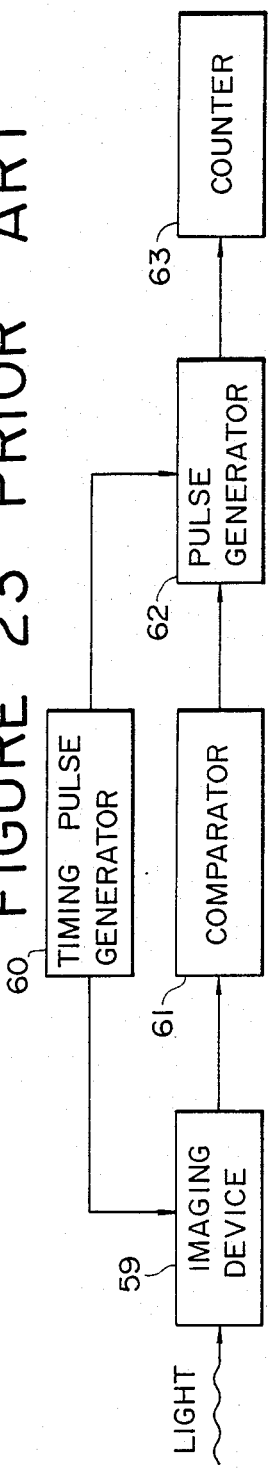
Figure 24:
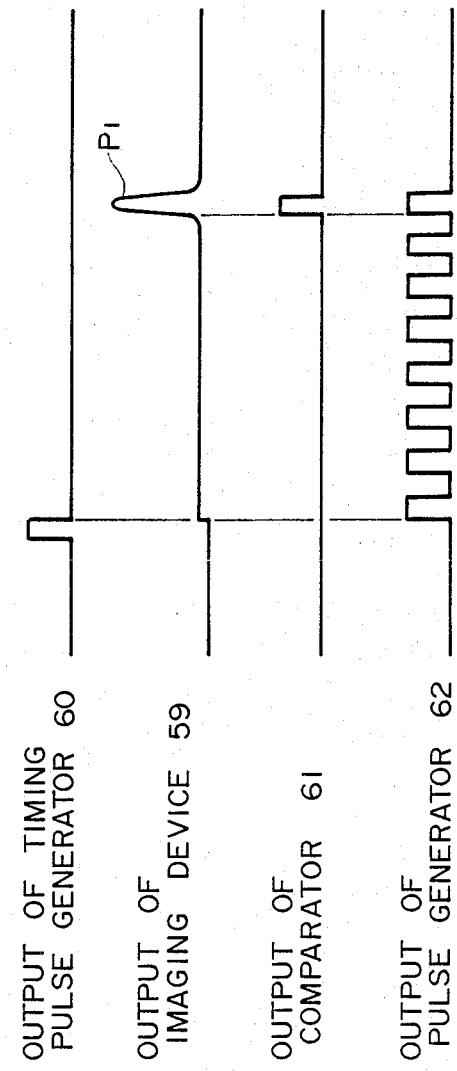
Figure 25:
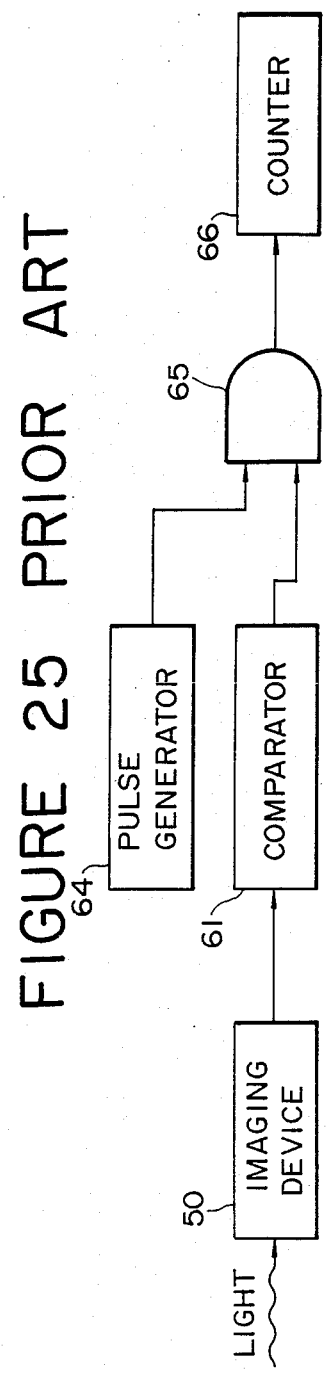
Figure 26:
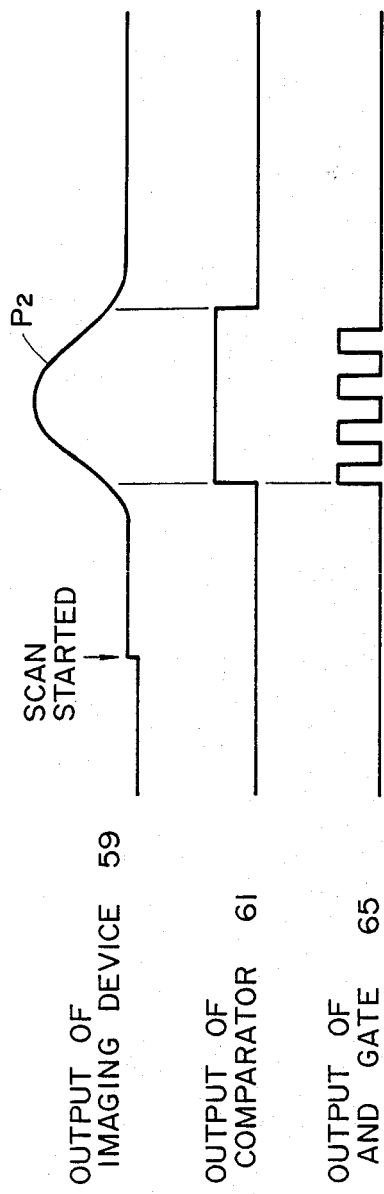

10. Tenth Embodiment of the Present Invention:

FIGS. 16 and 17 are for showing an apparatus for detecting position/variance of input light as a tenth embodiment of the present invention, of which FIG. 16 is a side view of the same and FIGS. 17 (a), (b) are graphs showing transmittance properties of a linear characteristic ND filter and a quadratic characteristic ND filter, respectively.

The tenth embodiment is based on the invention for obtaining one-dimensional average position, intensity, and variance of a beam of light, and as shown in FIG.

16, the tenth embodiment is provided with three sets of photomultipliers 35-37 as the photoelectric conversion devices each having a length of L. Here, the photomultiplier is an electron multiplier in which electrons emitted as a result of the photoelectric effect are increased in geometrical progression to provide an output corresponding to the intensity of the input light and is used specifically for photoelectric conversion of a weak beam of light.

The surface of the photomultiplier 36 on the input light side is covered by the linear characteristic ND filter 38, whereas the surface of the photomultiplier 37 on the input light side is covered by the quadratic characteristic ND filter 39. Here, the linear characteristic ND filter 38 has, as shown in FIG. 17(a), the transmittance bx proportional to the distance x from one end of the photomultiplier 36, whereas the quadratic characteristic ND filter 39 has, as shown in FIG. 17(b), the transmittance $b_2 x^2$ proportional to the square of the distance x from one end of the photomultiplier 37. Incidentally, the ND filter is a shortened form of the Neutral Density Filter whose transmittance is independent of the wavelength (color), i.e., whose spectral transmittance is flat.

In addition, the incoming beam of light is adapted to be split by half mirrors 40, 41 so as to be incident on each of the photosensitive surfaces of the photomultipliers 35-37 perpendicularly thereto.

With the described construction, when a beam of light having the light intensity distribution $\rho(x)$ the same as in FIG. 2 is incident thereon, the output obtained from the photomultiplier 35 which has no filter and allows the beam of light to enter therein directly becomes $$V_0 = K \cdot \int_0^L \rho(x)dx = K \cdot It \qquad (48)$$

and from this equation (48), the quantity relative to the total intensity of the beam of light can be obtained. The output $V_1$ from the photomultiplier 36 covered by the linear characteristic ND filter 38 becomes $$v_1 = K \cdot \int_0^L \rho(x) \cdot b_1 \cdot x \, dx \qquad (49)$$

and it becomes possible to obtain from the output $V_1$ the average value of the coordinates x weighted by the intensity of the beam of light. Similarly, the output $V_2$ from the photomultiplier 37 covered by the quadratic characteristic ND filter 39 becomes $$v_2 = K \cdot \int_0^L \rho(x) \cdot b_2 \cdot x^2 \, dx \qquad (50)$$

and it becomes possible to obtain from the output $V_2$ the average of the squares of the coordinates x weighted by the intensity of the beam of light. Here, K is efficiency of photoelectric conversion.

Thus, from equations (14), (48), (49), we obtain $$V_1/V_0 = b_1 \cdot \bar{x} \qquad (51)$$

and from this $V_1/V_0$, the linear output proportional to the average x of the distances $\bar{x}$ between one end of the photomultiplier 36 and the positions of the beam of light can be taken out.

And, from equations (14), (48), (50), we obtain $$V_2/V_0 = 2b_2 \cdot \overline{x^2} \qquad (52)$$

and from this $V_2/V_0$, the quadratic output proportional to the average $\overline{x^2}$ of the squares of the distances x between one end of the photomultiplier 37 and the positions of the beam of light can be taken out.

As a result of the foregoing, in the present embodiment, the total intensity It of the beam of light is obtained from equation (48), the average position $\bar{x}$ of the beam of light is obtained from equation (51), and the variance $\rho^2$ is obtained based on equations (51) and (52) from the following equation (53)

$$\sigma^2 = \frac{1}{2b_2} \cdot \frac{V_2}{V_0} - \left(\frac{1}{b_1} \cdot \frac{V_1}{v_0}\right)^2 \qquad (53)$$

Thus, also from the apparatus of the present embodiment, the same effect as obtained from the fifth embodiment can be obtained.

Although, in the above description of the first to tenth embodiments, embodiments for and obtainable effects in detecting average position, intensity, and the variance of slit light or spot light input have been disclosed, corpuscular rays such as electron rays and $\alpha$ rays can be equally detected for the average position, intensity, and variance by using semiconductor materials suited for treatment thereof.

As described so far, with any of the first to sixth apparatus for detecting position/variance of input light of the present invention, the linear output proportional to the average value of the distances between one end of the photoelectric conversion device and the positions of the light input and the quadratic output proportional to the average of the squares of the above distances can be easily detected. Thus, by the method for detecting position/variance of input light of the present invention, without using expensive imaging devices and signal processing circuits used in the prior art, the position and variance of the input light can be obtained based on the above linear output and quadratic output quite easily and economically and with high response and accuracy.

While the apparatus for detecting position/variance of input light of the present invention is applicable to various instruments, an example of such applications is a sensor for a surface roughness tester of a non-contact type as shown in FIG. 27, which functions on the principle that the intensity distribution of the scattered light depends on the roughness of the reflecting surface.

What is claimed is:

1. A method for detecting position/variance of input light using a photoelectric conversion device receiving input light comprising the steps of taking out a linear output proportional to an average of the distances between one end of said photoelectric conversion device and positions of the input light and a quadratic output proportional to an average of the squares of the distances between one end of said photoelectric conversion device and the positions of the input light, detecting the same as the position of said input light based on the linear output and, based on the linear output and the quadratic output, calculating to detect variance of said input light.

2. A method for detecting position/variance of input light according to claim 1, which further comprises detecting the light intensity of the input light, the average of the distances between one end of said photoelectric conversion device and the positions of the input light weighted by the light intensity, and the average of the squares of the distances between one end of said photoelectric conversion device and the positions of the input light weighted by the light intensity from said photoelectric conversion device, and taking out the linear output based on the detected light intensity and average and taking out the quadratic output based on the detected light intensity and average of the squares.

3. An apparatus for detecting position/variance of input light comprising a photoelectric conversion device receiving input light and which includes a first resistive layer formed of a first photoelectric conversion material and a second resistive layer formed of a second photoelectric conversion material connected with said first resistive layer through a depletion layer or directly, wherein said first resistive layer is provided with uniform resistivity throughout its surface so that a linear output proportional to the average of the distances between one end of said photoelectric conversion device and positions of the input light is detected and said second resistive layer is provided with resistivity dependent upon the distance from one end thereof so that a quadratic output proportional to the average of the squares of the distances between one end of said photoelectric conversion device and positions of the input light is detected.

4. An apparatus for detecting position/variance of input light comprising a photoelectric conversion device receiving input light and which includes a first resistive layer formed of a first photoelectric conversion material and a second resistive layer formed of a second photoelectric conversion material connected with said first resistive layer through a depletion layer or directly, wherein said first resistive layer is divided into a plurality of slip formed resistive layer segments, out of which those resistive layer segments located in the places numbered form one end thereof by predetermined numbers are provided with uniform resistivity throughout their surfaces so that a linear output proportional to the average of the distances between one end of said photoelectric conversion device and positions of the input light is detected, whereas those resistive layer segments located in the other places than the above mentioned places numbered from one end thereof by predetermined numbers are provided with resistivity dependent upon the distance from one end so that a quadratic output is proportional to the average of the squares of the distances between one end of said photoelectric conversion device and positions of the input light is detected.

5. An apparatus for detecting position/variance of input light comprising first and second photoelectric conversion devices for receiving input light, of which said first photoelectric conversion device is covered over the surface on the light input side by a first shielding mask which exposes the surface to the light according to the distance from one end of said photoelectric conversion device such that the exposed portion has its width at each position in proportion to the distance, so that a linear output proportional to the average of the distances between one end of said one photoelectric conversion device and positions of the input light is detected, and said second photoelectric conversion device is covered over the surface on the light input side by a second shielding mask which exposes the surface to the light according to the distance from one end of said photoelectric conversion device such that the exposed portion has its width at each position in proportion to the square of the distance, so that a quadratic output proportional to the average of the squares of the distances between one end of said other photoelectric conversion device and positions of the input light is detected.

6. An apparatus for detecting position/variance of input light comprising a photoelectric conversion device receiving input light, wherein the surface of said photoelectric conversion device on the light input side is covered by a first shielding mask which exposes the surface to the light according to the distance from one end of said photoelectric conversion device such that the width of the exposed portion at each position is proportional to the distance, so that a linear output proportional to the average of the distances between one end of said photoelectric conversion device and positions of the input light is detected, and by a second shielding mask which exposes the surface to the light according to the distance from one end of said photoelectric conversion device such that the exposed portion has the width thereof at each position proportional to the square of the distance so that a quadratic output proportional to the average of the squares of the distances between one end of said photoelectric conversion device and positions of the input light is detected, and further, said second shielding mask is arranged so as to comprise a shutter.

7. An apparatus for detecting position/variance of input light according to claim 6, wherein said first shielding mask comprises a shutter.

8. An apparatus for detecting position/variance of input light comprising a photoelectric conversion device receiving input light, wherein said photoelectric conversion device is divided by an insulating boundary which is, according to the distance from one end of said photoelectric conversion device, located at the lateral distance proportional to said distance, so that a linear output proportional to the average of the distances between one end of said photoelectric conversion device and positions of the input light is detected, and also divided by an insulating boundary which is, according to the distance from one end of said photoelectric conversion device, located at the lateral distance proportional to the square of said distance, so that a quadratic output proportional to the average of the squares of the distances between one end of said photoelectric conversion device and positions of the input light is detected.

9. An apparatus for detecting position/variance of input light comprising first and second photoelectric conversion devices receiving input light, of which said first photoelectric conversion device is covered over the surface on the light input side by a linear characteristic optical filter having transmittance at each position proportional to the distance from one end of said one photoelectric conversion device to the position, so that a linear output proportional to the average of the distances between one end of said one photoelectric conversion device and positions of the input light is detected, and said second photoelectric conversion device is covered over the surface on the light input side by a quadratic characteristic optical filter having transmittance at each position proportional to the square of the distance from one end of said other photoelectric conversion device to the position, so that a quadratic output proportional to the average of the squares of the distances between one end of said other photoelectric conversion device and positions of the input light is detected.

* * * * *